United States Patent [19]

Kodama

[11] Patent Number: 5,670,884
[45] Date of Patent: Sep. 23, 1997

[54] CONNECTOR TESTING DEVICE

[75] Inventor: Shinji Kodama, Haibara-gun, Japan

[73] Assignee: Yazaki Corporation, Tokyo, Japan

[21] Appl. No.: 665,099

[22] Filed: Jun. 14, 1996

[30] Foreign Application Priority Data

Jun. 16, 1995 [JP] Japan .................................. 7-150638

[51] Int. Cl.⁶ ............................................... H01H 31/04
[52] U.S. Cl. .......................... 324/538; 324/761; 439/489
[58] Field of Search ................................ 324/538, 537

[56] References Cited

U.S. PATENT DOCUMENTS

| | | | |
|---|---|---|---|
| 4,902,968 | 2/1990 | Sugimoto | 324/158 F |
| 5,179,343 | 1/1993 | Chishima | 324/538 |
| 5,335,413 | 8/1994 | Yamamoto | 29/593 |
| 5,455,515 | 10/1995 | Saijo | 324/538 |
| 5,481,204 | 1/1996 | Aikawa | 324/538 |

FOREIGN PATENT DOCUMENTS

| | | | |
|---|---|---|---|
| 62-47093 | 12/1987 | Japan | G01R 31/04 |
| 7-113836 | 5/1995 | Japan | G01R 31/04 |

*Primary Examiner*—Ernest F. Karlsen
*Assistant Examiner*—Thomas Valone
*Attorney, Agent, or Firm*—Sughrue, Mion, Zinn, Macpeak and Seas

[57] ABSTRACT

A connector testing device of the handy type which is capable of easily examining the condition of insertion of connection terminals in a connector. This device includes detection pins each including a tip end portion extending forwardly from a body portion thereof, and a detection portion which extends rearwardly from the body portion, and is smaller in cross-sectional area than the body portion. The detection pin is movable forward and rearward, and is normally urged forward. The device also includes a spacer having insertion holes each allowing the body portion to pass therethrough, the spacer being movable upward and downward, and being normally urged upward. In an upwardly-urged position of the spacer, the insertion hole allows the associated body portion to pass therethrough. When the detection pin is disposed in a forward position, only the detection portion passes through the associated insertion hole, and when the detection pin is disposed in a rearward position, at least part of the body portion passes through the associated insertion hole.

12 Claims, 6 Drawing Sheets

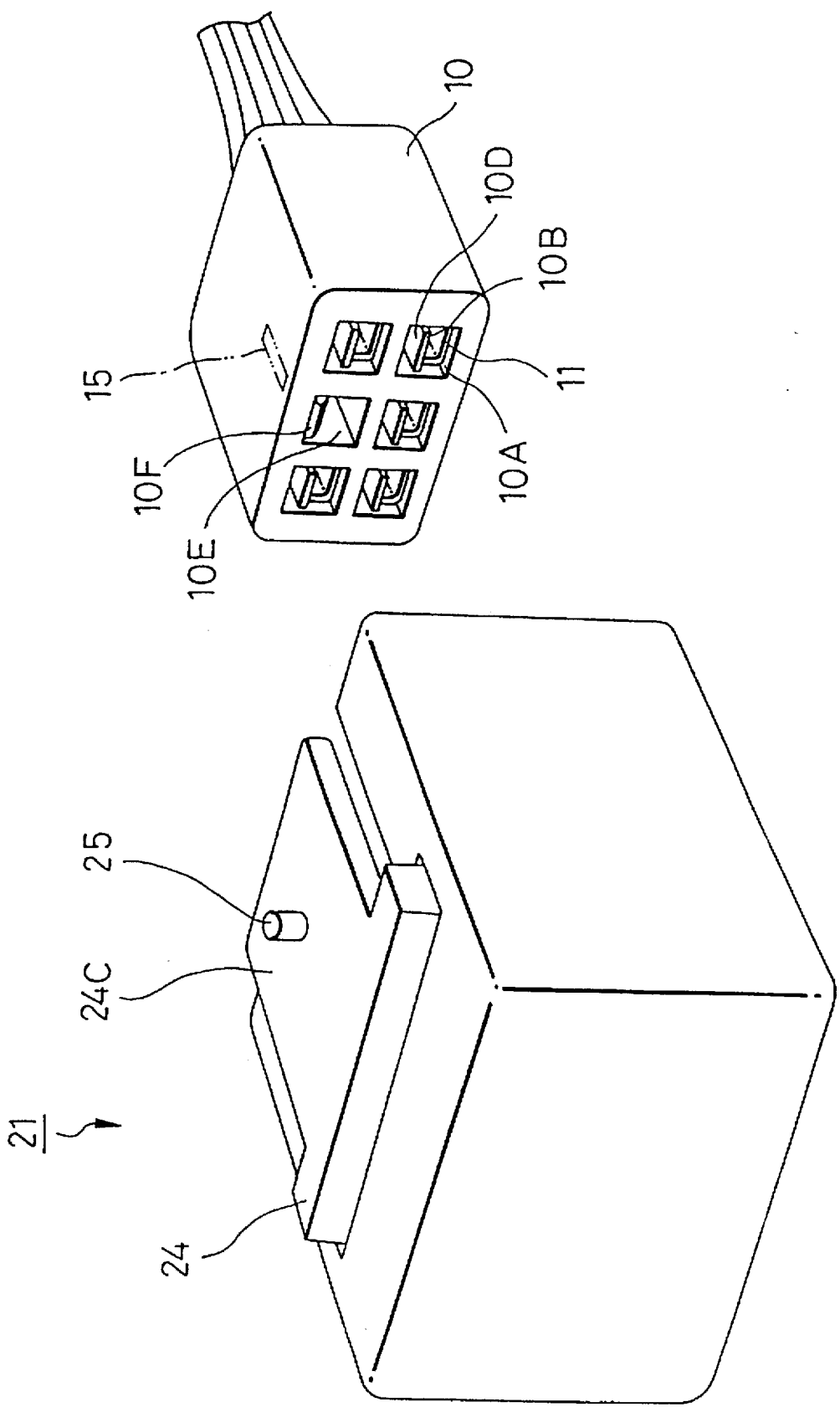

CONNECTOR TESTING DEVICE

BACKGROUND OF THE INVENTION

1. Field of the Invention

This invention relates to a connector testing device, and more particularly to a connector testing device of the handy type for examining a retained condition of terminals inserted in a connector housing.

2. Description of the Related Art

A connector testing device has an examination function of determining whether or not connection terminals are properly received in a connector housing. One such conventional testing device is disclosed, for example, in Japanese Utility Model Examined Publication No. Sho. 62-47093, and this is shown in FIG. 11. In FIG. 11, the testing device 100 includes a spacer 101A projecting toward a connector housing 10 to be examined (which is fitted in a base 101) in substantially facing relation to connection terminals 11 in the connector housing 10, and the testing device also includes a plurality of parallel examination pins 107 whose distal ends are opposed respectively to the connection terminals 11.

The examination pins 107 are connected to a conduction testing device 109, and the conduction testing device 109 detects a conduction condition when the examination pin 107 electrically contacts the connection terminal 11.

More specifically, if the connection terminal 11 is inserted into a proper position in the connector housing 10, the spacer 101A is inserted into a space 10C, formed in the connector housing 10, when the connector housing 10 is fitted in the base 101. In this case, since the spacer 101A can easily proceed into a predetermined position in the space 10C, each examination pin 107 also proceeds toward the connection terminal 11, and contacts the same to form a closed circuit. The conduction testing device 109 detects the conduction of this closed circuit, and therefore it can be confirmed that the connection terminal 11 has been inserted in the proper position. The space 10C is a retraction space for an elastically-deformable, elastic retaining piece portion (hereinafter referred to as "lance") 10B which retains the connection terminal 11 in the housing.

On the other hand, if the connection terminal 11 is incompletely inserted (that is, it is not inserted into the proper position) or is erroneously inserted, the spacer 101A is prevented from proceeding into the predetermined position, or even if the spacer can proceed to the predetermined position, the examination pin 107 can not contact the connection terminal 11 since the connection terminal 11 is in a retracted position. Therefore, in either case, the conduction testing device 109 does not detect conduction, and therefore the improper attachment of the connection terminal 11 can be detected.

In the conventional connector testing device, however, the fragile, narrow, elongate spacer 101A is exposed, and therefore when the connector housing 10 is pushed to contact the spacer 101A, the spacer 101A has been often damaged or bent. Therefore, it has been desired to provide a connector testing device more excellent in reliability.

The examination, using this connector testing device, is carried out at a final stage of the assembling process at which a wire harness has been assembled to a certain degree, and therefore even if the undesirable condition of the terminal is detected, much time and labor have been required to correct it.

SUMMARY OF THE INVENTION

The present invention has been made to overcome the above problems of the conventional device, and an object of the invention is to provide a connector testing device which is capable of examining the condition of insertion of connection terminals in a connector in an easy and highly-reliable manner.

According to a first aspect of the present invention, there is provided a connector testing device for a connector having a space and a lance provided in a connector housing, the lance having a retaining projection for retaining a connection terminal and being elastically deformable into the space, the connector testing device comprising: a hood portion for receiving the connector housing in such a manner that an outer surface of the connector housing is in contact with an inner surface of the hood portion; a detection pin including a tip end portion extending forwardly from a body portion thereof so as to be inserted into the space, and a detection portion which extends rearwardly from the body portion, and is smaller in cross-sectional area than the body portion, the detection pin being movable forward and rearward and being normally urged forward; first urging means for normally urging the detection pin forward; a spacer having an insertion hole having such a size as to allow the body portion to pass therethrough, the spacer being movable upward and downward and being normally urged upward, and in an upwardly-urged position of the spacer, the insertion hole allowing the body portion to pass therethrough; and second urging means for normally urging the spacer upward, wherein when the detection pin is disposed in a forward position, only the detection portion passes through the insertion hole, and when the detection pin is disposed in a rearward position, at least part of the body portion passes through the insertion hole.

According to a second aspect of the present invention, there is provided a connector testing device for a connector having a space and a lance provided in a connector housing, the lance having a retaining projection for retaining a connection terminal and being elastically deformable into the space, the connector testing device comprising: a hood portion for receiving the connector housing in such a manner that an outer surface of the connector housing is in contact with an inner surface of the hood portion; a detection pin including a tip end portion extending forwardly from a body portion thereof so as to be inserted into the space, and a detection portion which extends rearwardly from the body portion, and is smaller in cross-sectional area than the body portion, the detection pin being movable forward and rearward and being normally urged forward; first urging means for normally urging the detection pin forward; a spacer having an insertion hole having such a size as to allow the body portion to pass therethrough, the spacer being movable upward and downward and being normally urged upward; and second urging means for normally urging the spacer upward, wherein at least one of first and second slanting surfaces is formed with respect to the insertion hole and the body portion; the first slanting surface being formed at a front lower edge of the insertion hole and facing generally forwardly, and in an upwardly-urged position of the spacer, the first slanting surface being engageable with a rear edge of the body portion; and the second slanting surface being formed at a rear lower edge of the body portion and facing generally rearwardly, and in the upwardly-urged position of the spacer, the second slanting surface being engageable with a front edge of the insertion hole, and wherein when the detection pin is disposed in a forward position, only the detection portion passes through the insertion hole, and when the detection pin is disposed in a rearward position, at least part of the body portion passes through the insertion hole.

According to a third aspect of the present invention, there is provided a connector testing device for a connector having a space and a lance provided in a connector housing, the lance having a retaining projection for retaining a connection terminal and being elastically deformable into the space, the connector testing device comprising: a hood portion for receiving the connector housing in such a manner that an outer surface of the connector housing is in contact with an inner surface of the hood portion; a detection pin including a tip end portion extending forwardly from a body portion thereof so as to be inserted into the space, and a detection portion which extends rearwardly from the body portion, and is smaller in cross-sectional area than the body portion, the detection pin being movable forward and rearward and being normally urged forward; first urging means for normally urging the detection pin forward; a spacer having an insertion hole having such a size as to allow the body portion to pass therethrough, the spacer being movable upward and downward and being normally urged downward; second urging means for normally urging the spacer downward; a front panel extending from the spacer; and printing means, provided on an inner surface of the front panel, for applying a mark to an outer surface of the connector housing in a downward position of the spacer, wherein at least one of first and second slanting surfaces is formed with respect to the insertion hole and the body portion; the first slanting surface being formed at a front upper edge of the insertion hole and facing generally forwardly, and in a downwardly-urged position of the spacer, the first slanting surface being engageable with a rear edge of the body portion; and the second slanting surface being formed at a rear upper edge of the body portion and facing generally rearwardly, and in the downwardly-urged position of the spacer, the second slanting surface being engageable with a front edge of the insertion hole, and wherein when the detection pin is disposed in a forward position, only the detection portion passes through the insertion hole, and when the detection pin is disposed in a rearward position, at least part of the body portion passes through the insertion hole.

According to a fourth aspect of the present invention, there is provided a connector testing device for a connector having a space and a lance provided in a connector housing, the lance having a retaining projection for retaining a connection terminal and being elastically deformable into the space, the connector testing device comprising: a hood portion for receiving the connector housing in such a manner that an outer surface of the connector housing is in contact with an inner surface of the hood portion; a detection pin including a tip end portion extending forwardly from a body portion thereof so as to be inserted into the space, and a detection portion which extends rearwardly from the body portion, and is smaller in cross-sectional area than the body portion, the detection pin being movable forward and rearward and being normally urged forward; first urging means for normally urging the detection pin forward; a spacer having an insertion hole having such a size as to allow the body portion to pass therethrough, the spacer being movable upward and downward and being normally urged upward, and in an upwardly-urged position of the spacer, the insertion hole allowing the body portion to pass therethrough; second urging means for normally urging the spacer upward; a front panel extending from the spacer; and printing means, provided on an inner surface of the front panel, for applying a mark to an outer surface of the connector housing in a downward position of the spacer, wherein when the detection pin is disposed in a forward position, only the detection portion passes through the insertion hole, and when the detection pin is disposed in a rearward position, at least part of the body portion passes through the insertion hole.

According to a fifth aspect of the present invention, there is provided a connector testing device for a connector having a space and a lance provided in a connector housing having a projection formed on an outer surface thereof, the lance having a retaining projection for retaining a connection terminal and being elastically deformable into the space, the connector testing device comprising: a hood portion for receiving the connector housing in such a manner that an outer surface of the connector housing is in contact with an inner surface of the hood portion; a detection pin including a tip end portion extending forwardly from a body portion thereof so as to be inserted into the space, and a detection portion which extends rearwardly from the body portion, and is smaller in cross-sectional area than the body portion, the detection pin being movable forward and rearward and being normally urged forward; first urging means for normally urging the detection pin forward; a spacer having an insertion hole having such a size as to allow the body portion to pass therethrough, the spacer being movable upward and downward and being normally urged downward; second urging means for normally urging the spacer downward; a front panel extending from the spacer; and a projected blade, formed on an inner surface of the front panel, for cutting the projection on the connector housing in a downward position of the spacer, wherein at least one of first and second slanting surfaces is formed with respect to the insertion hole and the body portion; the first slanting surface being formed at a front upper edge of the insertion hole and facing generally forwardly, and in a downwardly-urged position of the spacer, the first slanting surface being engageable with a rear edge of the body portion; and the second slanting surface being formed at a rear upper edge of the body portion and facing generally rearwardly, and in the downwardly-urged position of the spacer, the second slanting surface being engageable with a front edge of the insertion hole, and wherein when the detection pin is disposed in a forward position, only the detection portion passes through the insertion hole, and when the detection pin is disposed in a rearward position, at least part of the body portion passes through the insertion hole.

According to a sixth aspect of the present invention, there is provided a connector testing device for a connector having a space and a lance provided in a connector housing having a projection formed on an outer surface thereof, the lance having a retaining projection for retaining a connection terminal and being elastically deformable into the space, the connector testing device comprising: a hood portion for receiving the connector housing in such a manner that an outer surface of the connector housing is in contact with an inner surface of the hood portion; a detection pin including a tip end portion extending forwardly from a body portion thereof so as to be inserted into the space, and a detection portion which extends rearwardly from the body portion, and is smaller in cross-sectional area than the body portion, the detection pin being movable forward and rearward and being normally urged forward; first urging means for normally urging the detection pin forward; a spacer having an insertion hole having such a size as to allow the body portion to pass therethrough, the spacer being movable upward and downward and being normally urged upward, and in an upwardly-urged position of the spacer, the insertion hole allowing the body portion to pass therethrough; second urging means for normally urging the spacer upward; a front panel extending from the spacer; and a projected blade, formed on an inner surface of the front panel, for cutting the projection on the connector housing in a downward position of the spacer, wherein when the detection pin is disposed in a forward position, only the detection portion passes through the insertion hole, and when the detection pin is disposed in a rearward position, at least part of the body portion passes through the insertion hole.

BRIEF DESCRIPTION OF THE DRAWINGS

FIG. 8 is a perspective view showing the examination by the connector testing device of FIG. 6;

DETAILED DESCRIPTION OF THE PREFERRED EMBODIMENTS

A preferred embodiment of the present invention will now be described with reference to the drawings.

Figure 1:
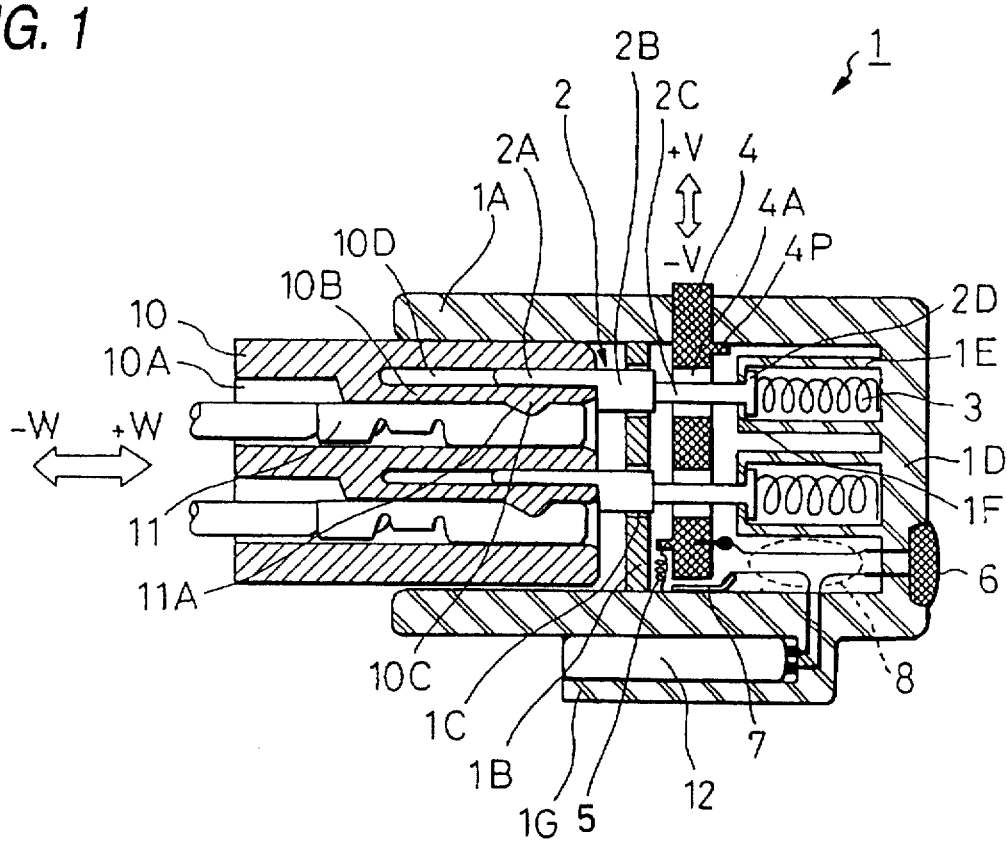
FIG. 1 is a cross-sectional view showing a first embodiment of a connector testing device of the invention.

FIG. 1 is a cross-sectional view showing a first embodiment of a connector testing device of the invention.

First, the construction of the connector testing device of the invention will be described with reference to FIG. 1. In FIG. 1, reference numeral 1 designates the connector testing device. A connector to be examined has spaces 10D and lances 10B in a connector housing 10, each of the lances 10B being elastically deformable into the associated space 10D and having a retaining projection 10C. Connection terminals 11, inserted respectively into terminal receiving chambers 10A, are retained by the lances 10B, respectively.

The connector testing device 1 is of a substantially hollow tubular shape, and has a front portion defining a hood portion 1A for receiving the connector housing 10 in such a manner that an outer surface of the connector housing 10 is in contact with an inner surface of the hood portion 1A, and a rear portion 1D.

For description purposes, the direction of the hood portion 1A (indicated by arrow −W) will be referred to as a forward direction, and the direction of the rear portion 1D (indicated by arrow +W) as a rearward direction. Also, an upward direction in the drawings will be referred to as a upward direction (indicated by arrow +V), and the opposite direction as a downward direction.

The connector testing device 1 comprises a plurality of detection pins 2, a spacer 4 having insertion holes 4A through which the detection pins 2 pass, respectively, and coil springs (urging means) 3 respectively urging the detection pins 2 forwardly.

Urging portions 1E of a hollow tubular construction are fixedly formed in the rear portion 1D, and extend forwardly, and each of the urging portions 1E has an opening (orifice portion) 1F at an distal end thereof. The spacer 4 is disposed forwardly of the urging portions 1E, and is movable upward and downward.

A detection pin support wall 1B is fixedly provided forwardly of the spacer 4 (that is, substantially centrally of the length of the connector testing device body), and has a plurality of through holes 1C formed therethrough.

The detection pin 2 includes a body portion 2B of a relatively large cross-section passed through the through hole 1C in the detection pin support wall 1B for movement forward and rearward, a tip end portion 2A which extends forwardly from the body portion 2B, and is insertable into the space 10D in the connector housing 10, and a detection portion 2C which extends rearwardly from the body portion 2B, and is smaller in cross-sectional area than the body portion 2B. A rear end of the detection portion 2C is enlarged as at 2D, and the enlarged end 2D is movably received in the urging portion 1E. The enlarged end 2D is larger in cross-sectional area than the opening in the urging portion 1E.

The coil spring 3 is mounted within the urging portion 1E. The coil spring 3 serves as urging means, and normally urges the enlarged end 2D forwardly. Therefore, the detection pin 2 is normally urged forwardly. The enlarged end 2D is larger in cross-sectional area than the orifice 1F of the urging portion 1E as described above, and the forward projecting of the detection pin 2 is limited by this arrangement.

The spacer 4 is movable upward and downward, and is normally urged upward. The spacer 4 has the insertion holes 4A each having such a cross-section as to allow the body portion 2B to pass therethrough. The upward movement of the upwardly-urged spacer 4 is limited by the engagement of a projection 4P (which projects from one side or face of the spacer 4) with the inner surface of the hood portion 1A.

When the spacer 4 is urged into the upper limit position, the body portion 1B can be inserted into the insertion hole 4A.

The spacer 4 is normally urged upward by upwardly urging springs (urging means) 5.

When the detection pin 2 is disposed in a forward position (that is, urged in the direction −W) as shown in FIG. 1, only the detection portion 2C passes through the insertion hole 4A. On the other hand, when the detection pin 2 is moved rearward (that is, in the direction +W), at least part of the body portion 2B of the detection pin 2 passes through the insertion hole 4A.

Preferably, a cell 12 is attached to a cell holder portion 1G formed on the outer peripheral surface of the connector testing device 1, and a LED 6, serving as an indicator, is embedded in the rear portion 1D, and a contact terminal 7 is provided in spaced relation to the spacer 4, and these parts are connected together by a detection circuit 8, and with this arrangement the contact terminal 7 is connected and disconnected in accordance with the downward and upward movement of the spacer 4, thereby activating and deactivating the LED 6.

When the operator fits the housing 10 of the connector to be examined into the distal end of the hood portion 1A of the connector testing device 1 of the above construction, and further inserts this housing 10 deep into the hood portion 1A in the direction +W, the tip end portions 2A of the detection pins 2, projecting from the detection pin support wall 1B (provided at the inner end of the hood portion 1A) toward the distal end of the hood portion 1A, are inserted respectively into the spaces 10D in the connector housing 10.

At this time, if each connection terminal 11 has been properly inserted in the connector housing 10, the retaining projection 10C on the associated lance 10B is engaged in a retaining hole 11A in the connection terminal 11, and therefore the lance 10B is not in a displaced condition, and the space 10D is in a proper open condition. As a result, as the connector housing 10 proceeds toward the inner end of the hood portion 1A, the tip end portions 2A of the detection pins 2 are smoothly introduced into the spaces 10D, respectively, and the detection pins 2 are kept urged forward (that is, in the direction −W).

This condition is kept until the front end of the connector housing 10 abuts against the detection pin support wall 1B, thus stopping the insertion of the connector housing. Namely, during this operation, the detection pins 2 are not pushed back rearward (that is, in the direction +W), or the detection pins 2 are pushed back rearward (in the direction +W) to such an extent that the body portions 2B are not inserted into the respective insertion holes 4A.

Thus, in the completely-inserted condition of the connector housing 10, the detection pins 2 are held in the forward position, and therefore only the detection portions 2C of a smaller cross-section are passed respectively through the insertion holes 4A. A gap is provided between the upper surface of each insertion hole 4A and the associated detection portion 2C, and therefore the operator can press the spacer 4 downward by pushing the projected upper end of the spacer 4 with the finger or the like. Namely, in the inserted condition of the connector housing 10, if the spacer 4 can be pressed down, this indicates that the connection terminals 11 are properly engaged respectively in the terminal receiving chambers 10A in the connector housing 10. The examination can be effected in this manner. Particularly when the LED 6 and the associated parts are provided as described above, the depressing of the spacer 4 can be confirmed easily and positively through lighting of the LED 6.

In contrast, if any of the connection terminals 11 is incompletely inserted in the associated terminal receiving chamber 10A, so that the retaining projection 10C on the associated lance 10B is not properly engaged in the retaining hole 11A in this connection terminal 11, the retaining projection 10C is urged upward by a tubular portion of the connection terminal 11, and the lance is tilted to close the space 10D. Therefore, the tip end portion 2A is prevented by the lance from being fitted into the space 10D.

When the operator tries to further push the connector housing 10, the detection pin 2 is moved back in the testing device. More specifically, the detection pin 2 is moved rearward (in the direction +W) against the bias of the coil spring 3, so that the body portion 2B is inserted into the insertion hole 4A. Since the insertion hole 4A is substantially equal in size to the body portion 2B, no gap is provided between the upper surface of the insertion hole 4A and the body portion 2B. Therefore, it seems that the spacer 4 is retained by the body portion 2B.

As a result, even if the operator tries to depress the upper end of the spacer 4 with the finger or the like, the spacer 4 will not move. Namely, if the spacer 4 can not be pressed down in the completely-inserted condition of the connector housing 10, at least one of the connection terminals 11 is in an improperly-engaged condition in the associated terminal receiving chamber 10A. Therefore, the examination of the incompletely-inserted terminal can be effected. Particularly when the LED 6 and the associated parts are provided as described above, whether or not the spacer 4 can be pressed down can be confirmed easily and positively through lighting of the LED 6.

Figure 2:
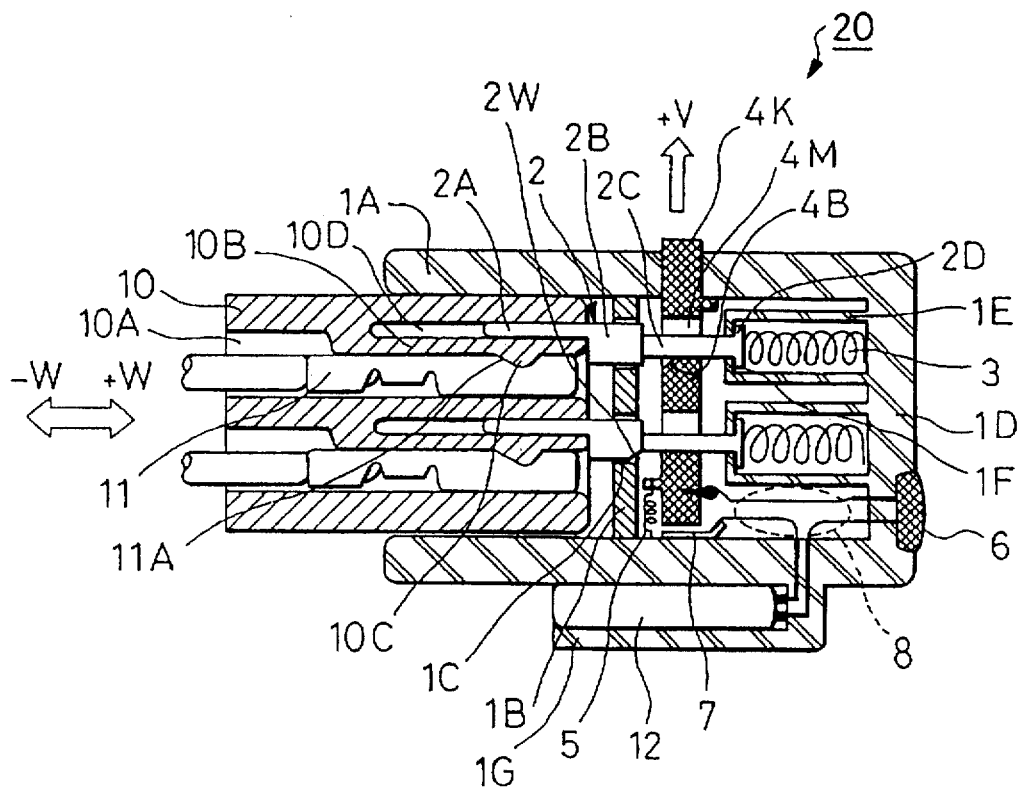
FIG. 2 is a cross-sectional view showing a second embodiment of the connector testing device of the invention.

FIG. 2 is a cross-sectional view showing a second embodiment of the connector testing device of the invention. The construction of the second embodiment of the invention will now be described with reference to FIG. 2. The portions of this embodiment identical to those of the preceding embodiment will be designated by the same reference numerals, respectively, and explanation thereof will be omitted.

The connector testing device 20 of this embodiment includes a spacer 4K having insertion holes 4M through which body portions 2B of detection pins 2 can pass, respectively. The spacer 4K is movable upward and downward, and is normally urged upward. Upwardly-urging springs (urging means) 5 normally urge the spacer 4K upward.

A slanting surface 4B is formed at a front lower edge of the insertion hole 4M facing a detection pin support wall 1B, and substantially faces the detection pin support wall 1B. In the upwardly-urged condition of the spacer, the slanting surface 4B is engageable with a rear lower edge of the body portion 2B of the detection pin 2.

Alternatively, a slanting surface 2W is formed at the rear lower edge of the body portion 2B of the detection pin 2, and faces generally rearwardly. In the upwardly-urged condition of the spacer 4K, the slanting surface 2W is engageable with the front lower edge of the insertion hole 4M facing the detection pin support wall 1B. Namely, at least one of the above two arrangements is provided.

As in the preceding embodiment, when the detection pin 2 is disposed in a forward position, only a detection portion 2C of the detection pin 2 passes through the insertion hole 4M, and when the detection pin 2 is disposed in a rearward position, at least part of the body portion 2B of the detection pin 2 passes through the insertion hole 4M.

Figure 3:
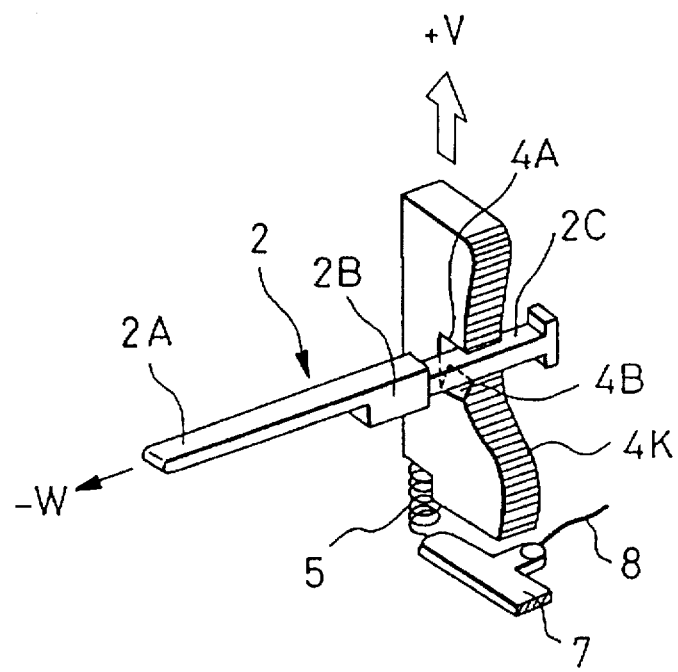
FIG. 3 is a partly-broken, perspective view showing the operation of a spacer in the connector testing device of FIG. 2.

FIG. 3 is a partly-broken, perspective view showing the operation of the spacer in the connector testing device of FIG. 2.

Figure 4:
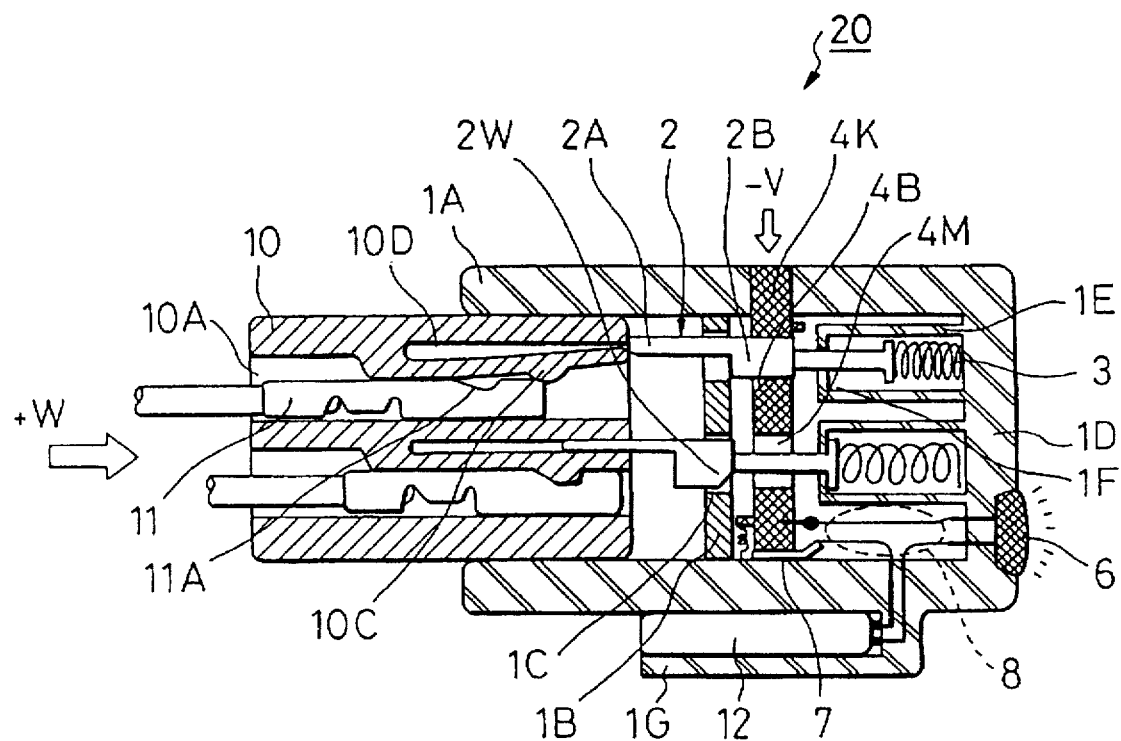
FIG. 4 is a cross-sectional view showing the examination of a connector, having an incompletely-inserted terminal, by the connector testing device of FIG. 2.

FIG. 4 is a cross-sectional view showing the examination of a connector (in which a terminal is incompletely inserted) by the connector testing device of FIG. 2.

Figure 5:
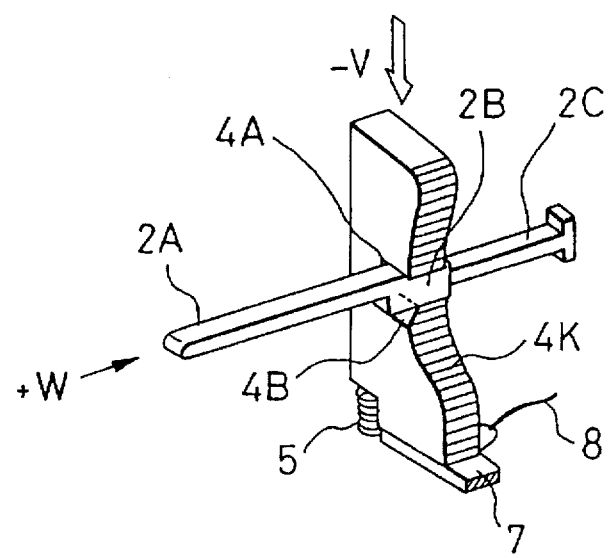
FIG. 5 is a partly-broken, perspective view showing the operation of the spacer in the connector testing device in the condition of FIG. 4.

FIG. 5 is a partly-broken, perspective view showing the operation of the spacer in the connector testing device in the condition of FIG. 4. The operation of the second embodiment will be described with reference to FIGS. 2 to 5.

When the operator fits a connector housing 10 to be examined into a distal end of a hood portion 1A of the connector testing device 20, and further inserts this housing 10 deep into the hood portion 1A in a direction +W, tip end portions 2A of the detection pins 2, projecting from the detection pin support wall 1B (provided at the inner end of the hood portion 1A) toward the distal end of the hood portion 1A, are inserted respectively into spaces 10D in the connector housing 10.

At this time, if each connection terminal 11 has been properly inserted in the connector housing 10, the space 10D is in a proper open condition as described above in the first embodiment. As a result, as the connector housing 10 proceeds toward the inner end of the hood portion 1A, the tip end portions 2A of the detection pins 2 are smoothly introduced into the spaces 10D, respectively, and the detection pins 2 are kept urged forward (that is, in a direction −W) (see FIGS. 2 and 3).

This condition is kept until the front end of the connector housing 10 abuts against the detection pin support wall 1B, thus stopping the insertion of the connector housing. Therefore, since the spacer 4K will not move downward, a contact terminal 7 is kept open, and electric current does not flow through a LED 6, and therefore the LED 6 is kept deactivated.

Thus, in the completely-inserted condition of the connector housing 10, if the LED 6 is in a deactivated condition, this indicates that the connection terminals 11 are properly engaged respectively in terminal receiving chambers 10A. In this manner, the examination can be effected easily and positively through the condition of indication of the LED 6.

In contrast, if any of the connection terminals 11 is incompletely inserted in the associated terminal receiving chamber 10A, so that a retaining projection 10C on an associated lance 10B is not properly engaged in a retaining hole 11A in this connection terminal 11 (see FIG. 4), the tip end portion 2A is prevented by the lance from being fitted into the space 10D.

When the operator tries to further push the connector housing 10, the detection pin 2 is moved back in the testing device by the lance 10B of the connector housing 10. More specifically, the detection pin 2 is moved rearward (in the direction +W) against the bias of a coil spring 3, so that the rear lower edge of the body portion 2B is brought into contact with the slanting surface 4B of the insertion hole 4M in the spacer 4K, or the slanting surface 2W of the body portion 2B contacts the lower edge of the insertion hole 4M of the spacer 4K facing the detection pin support wall 1B. As a result, a force acts on the slanting surface 4B in the direction +W, so that the spacer 4K is forced downward by a force acting in a direction −V (see FIG. 5). As a result, the contact terminal 7 is rendered conductive to light the LED 6. Namely, if the LED 6 is lighted in the inserted condition of the connector housing 10, this indicates that the connection terminal 11 is improperly engaged in the terminal receiving chamber 10A. In this manner, the incompletely-inserted terminal can be examined or detected easily and positively.

Figure 6:
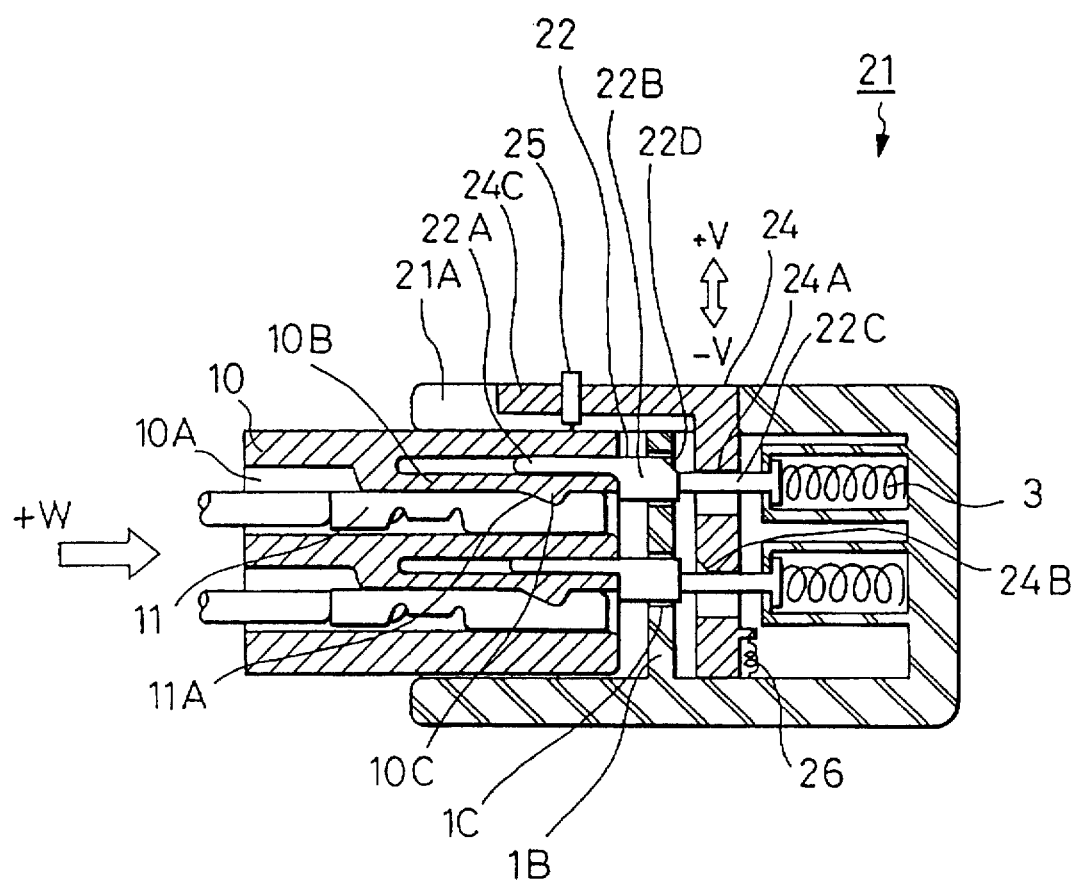
FIG. 6 is a cross-sectional view showing a third embodiment of the connector testing device of the invention.

FIG. 6 is a cross-sectional view showing a third embodiment of the connector testing device of the invention. The construction of the third embodiment of the invention will now be described with reference to FIG. 6. The portions of this embodiment identical to those of the above embodiments will be designated by the same reference numerals, respectively, and explanation thereof will be omitted.

In FIG. 6, the connector testing device 21 of this embodiment includes a front panel 24C extending from a spacer 24 toward a connector housing 10 to be fitted into the connector testing device 21. The front panel 24C has a marker (printing means) 25 provided at its front end portion, the marker 25 projecting from an inner surface of the front panel 24C. The spacer 24 has insertion holes 24A each having such a size as to allow a body portion 22B of a detection pin 22 to pass therethrough. The spacer 24 is movable upward and downward, and is normally urged downward. Downwardly-urging springs (urging means) 26 normally urge the spacer 24 downward.

A slanting surface 24B is formed at an upper edge of the insertion hole 24A facing a detection pin support wall 1B,
and substantially faces the detection pin support wall 1B. In the downwardly-urged condition of the spacer, the slanting surface 24B is engageable with a rear upper edge of the body portion 22B of the detection pin 22.

Alternatively, a slanting surface 22D is formed at the rear upper edge of the body portion 22B of the detection pin 22, and faces generally rearwardly. In the downwardly-urged condition of the spacer, the slanting surface 22D is engageable with the front edge of the insertion hole 24A facing the detection pin support wall 1B. Namely, at least one of the above two arrangements is provided.

Figure 7:
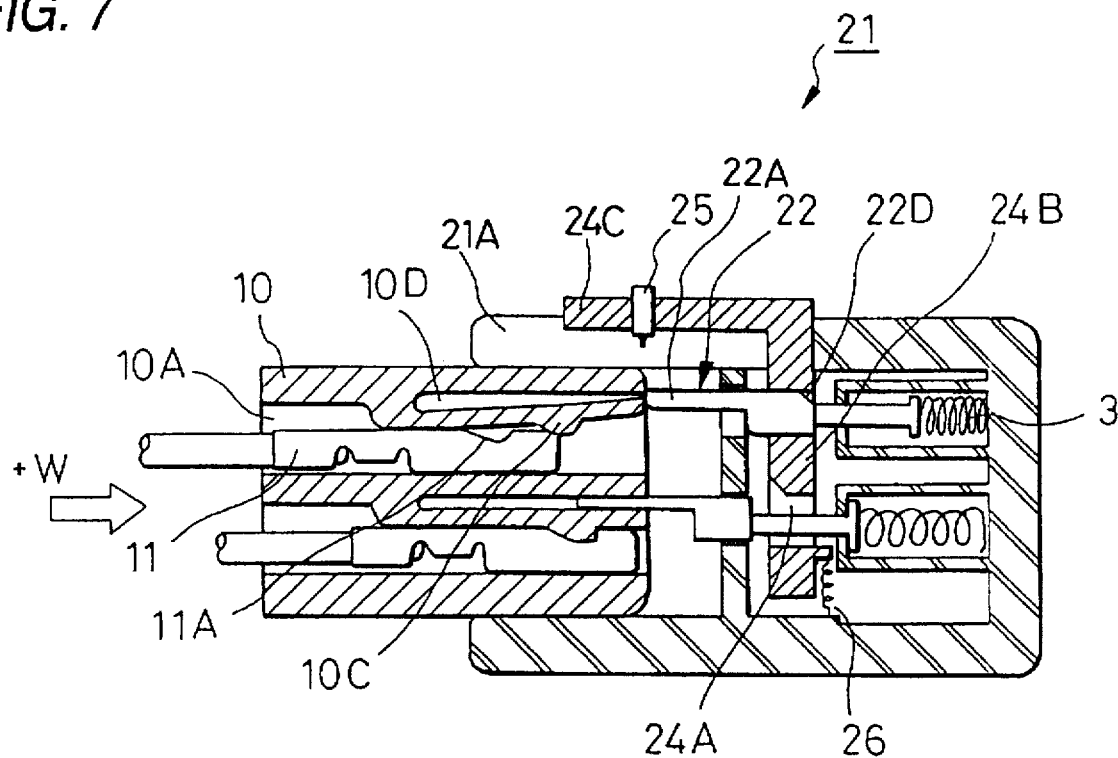
FIG. 7 is a cross-sectional view showing the examination of a connector, having an incompletely-inserted terminal, by the connector testing device of FIG. 6.

FIG. 7 is a cross-sectional view showing the examination of a connector (in which a terminal is incompletely inserted) by the connector testing device of FIG. 6.

FIG. 8 is a perspective view showing the connector testing operation by the connector testing device of FIG. 6. The operation of the third embodiment will be described with reference to FIGS. 6 to 8.

When the operator fits a connector housing 10 to be examined into a distal end of a hood portion 21A of the connector testing device 21, and further inserts this housing 10 deep into the hood portion 21A in a direction +W, tip end portions 22A of the detection pins 22, projecting from the detection pin support wall 1B (provided at the inner end of the hood portion 21A) toward the distal end of the hood portion 21A, are inserted respectively into spaces 10D in the connector housing 10.

At this time, if each connection terminal 11 has been properly inserted in the connector housing 10, the space 10D is in a proper open condition as described above in the above embodiments. As a result, as the connector housing 10 proceeds toward the inner end of the hood portion 21A, the tip end portions 22A of the detection pins 22 are smoothly introduced into the spaces 10D, respectively, and the detection pins 22 are kept urged forward (that is, in a direction −W) (see FIG. 6), or the detection pins 22 are moved back in a direction +W to such an extent that the body portions 22B are not inserted into the respective insertion holes 24A.

This condition is kept until the front end of the connector housing 10 abuts against the detection pin support wall 1B, thus stopping the insertion of the connector housing. Therefore, since the spacer 24 is not moved upward, the marker 25 applies ink to the upper surface of the connector housing 10. The position of mounting of the marker 25 on the front panel 24C is determined in connection with the relation between the amount of insertion of the connector housing 10 and the amount of projection of the detection pins 22, and the marker 25 will not apply ink to the upper surface of the connector housing 10 before the completely-inserted connection terminals 11 are detected.

The connector housing 10, when pushed into and withdrawn from the hood portion 21A, is moved, and therefore if the connection terminals 11 are properly inserted respectively in terminal receiving chambers 10A, a line of mark 15 is printed on the upper surface of the connector housing 10 (see FIG. 8).

In contrast, if any of the connection terminals 11 is incompletely inserted in the connector housing 10, so that a retaining projection 10C on an associated lance 10B is not properly engaged in a retaining hole 11A in this connection terminal 11 (see FIG. 7), the tip end portion 22A is prevented by the lance from being fitted into the space 10D.

When the operator tries to further push the connector housing 10, the detection pin 22 is moved back in the testing device by the lance 10B. More specifically, the detection pin 22 is moved rearward (in the direction +W) against the bias of a coil spring 3, so that the slanting surface 22D of the body portion 22B is brought into contact with the upper edge of the insertion hole 24A in the spacer 24, or the rear upper edge of the body portion 22B contacts the slanting surface 24B of the insertion hole 24A in the spacer 24. As a result, the spacer 24 is moved upward (see FIG. 7), and the marker 25 is moved away from the upper surface of the connector housing 10. Therefore, the marker 25 will not apply ink to the upper surface of the connector housing 10.

Thus, merely by confirming whether or not there is a line of mark on the upper surface of the connector housing 10 after inserting and withdrawing the connector housing 10, the terminal-inserted condition can be easily examined.

In this embodiment, the spacer 24 is normally urged downward, and if there does not exist any incompletely-inserted connection terminal 11, the mark is automatically applied to the connector housing 10 by the marker 25 held in contact with the upper surface of the connector housing 10 to be examined.

In this embodiment, although the marking is automatically effected in accordance with the insertion and withdrawal of the connector housing 10, the invention is not limited to such a construction. For example, there can be provided a construction in which a spacer, normally urged upward as shown in FIG. 1, is kept pressed down, for example, manually during the insertion and withdrawal of the connector housing, thereby applying a mark to the connector housing.

Further, the confirmation through lighting of an LED as described above may be employed.

Figure 9:
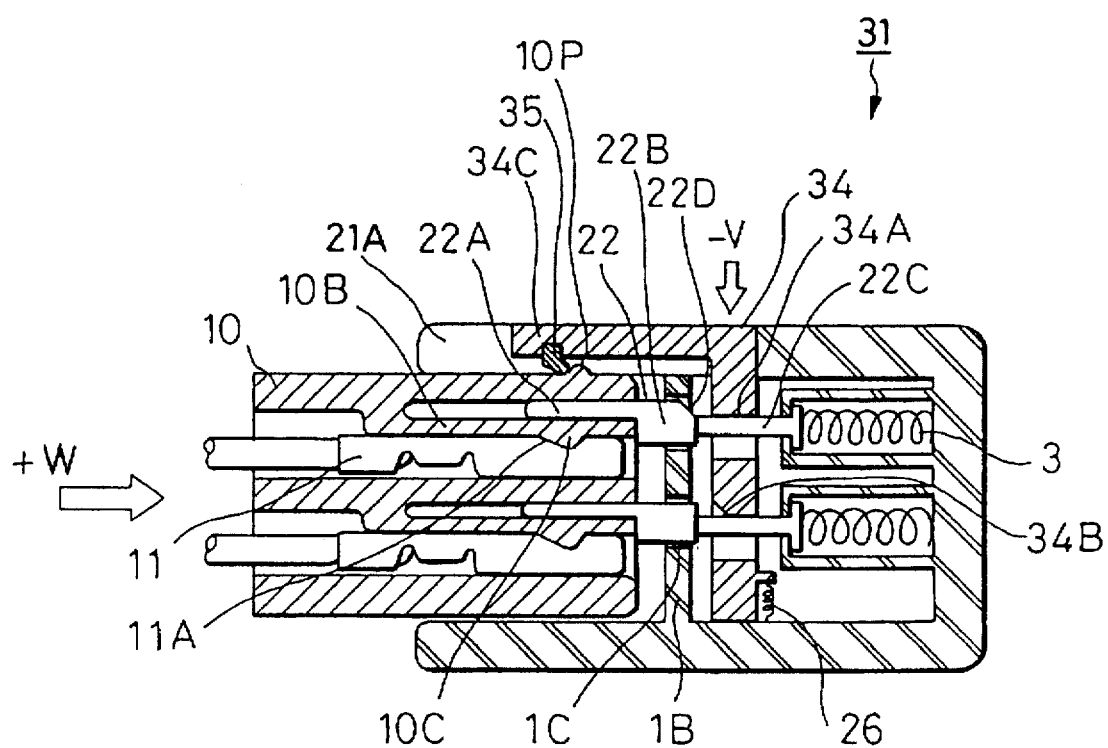
FIG. 9 is a cross-sectional view showing a fourth embodiment of the connector testing device of the invention.

FIG. 9 is a cross-sectional view showing a fourth embodiment of the connector testing device of the invention. The construction of the fourth embodiment of the connector testing device of the invention will now be described with reference to FIG. 9. The portions of this embodiment identical to those of the above embodiments will be designated by the same reference numerals, respectively, and explanation thereof will be omitted.

In FIG. 9, the connector testing device 31 of this embodiment includes a front panel 34C extending from a spacer 34 toward a connector housing 10 to be fitted into the connector testing device 31. The front panel 34C has a projected blade 35 projected from an inner surface thereof at a front end portion thereof. A projection 10P, which can be easily cut by a blade or the like, is formed on an upper surface of the connector housing 10 at a front end portion thereof.

The spacer 34 is movable upward and downward, and is normally urged downward.

A slanting surface 34B is formed at an upper edge of an insertion hole 34A facing a detection pin support wall 1B. In the downwardly-urged condition of the spacer 34, the slanting surface 34B is engageable with a rear upper edge of a body portion 22B of a detection pin 22.

Alternatively, a slanting surface 22D is formed at the rear upper edge of the body portion 22B of the detection pin 22, and faces generally rearwardly. In the downwardly-urged condition of the spacer 34, the slanting surface 22D is engageable with the front edge of the insertion hole 34A facing the detection pin support wall 1B. Namely, at least one of the above two arrangements is provided.

Figure 10:
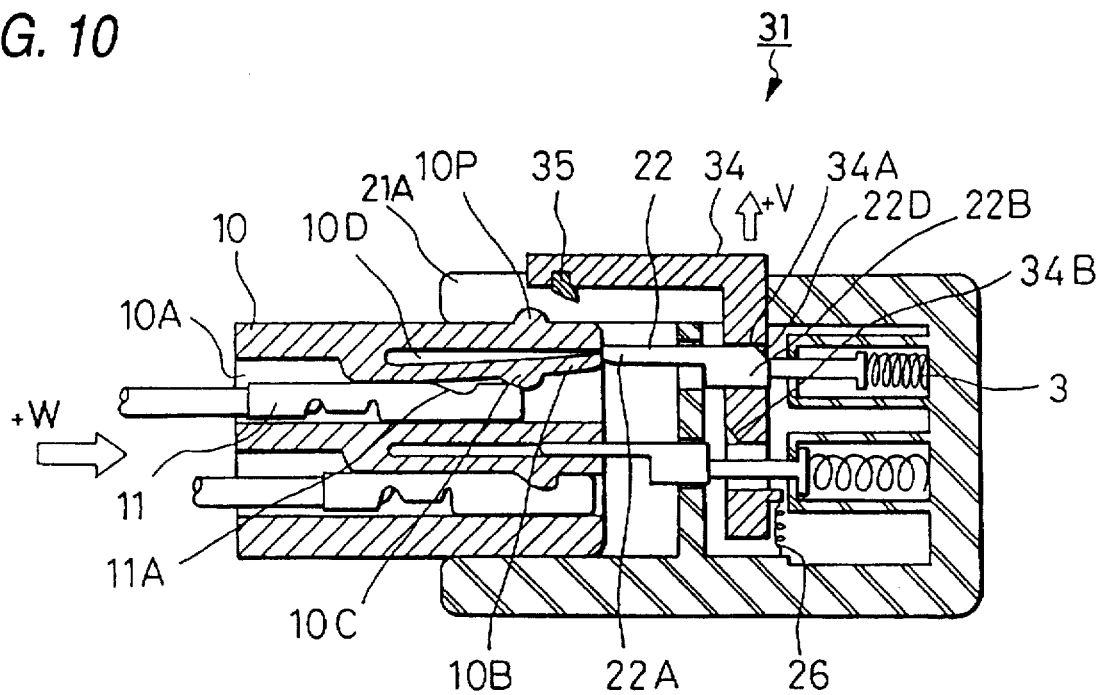
FIG. 10 is a cross-sectional view showing the examination of a connector, having an incompletely-inserted terminal, by the connector testing device of FIG. 9.
Figure 11:
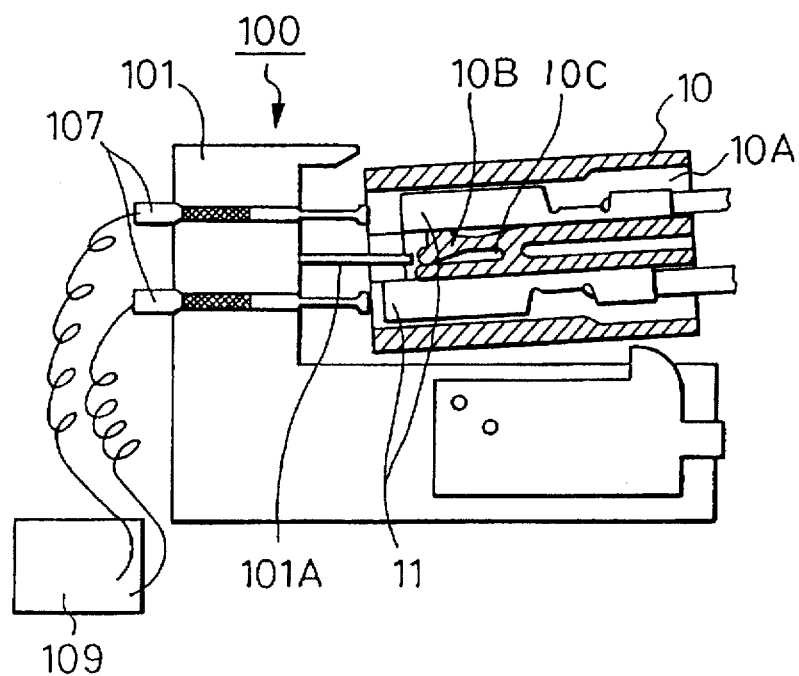
FIG. 11 is a cross-sectional view showing a conventional connector testing device.

FIG. 10 is a cross-sectional view showing the examination of a connector (in which a terminal is incompletely inserted) by the connector testing device of FIG. 9. The operation will be described with reference to FIGS. 9 and 10.

When the operator fits the connector housing 10 to be examined into a distal end of a hood portion 21A of the connector testing device 31, and further inserts this housing 10 deep into the hood portion 21A in a direction +W, tip end portions 22A of the detection pins 22, projecting from the detection pin support wall 1B (provided at the inner end of the hood portion 21A) toward the distal end of the hood portion 21A, are inserted respectively into spaces 10D in the connector housing 10.

At this time, if each connection terminal 11 has been properly inserted in the connector housing 10, the space 10D is in a proper open condition as described above in the above embodiments. As a result, as the connector housing 10 proceeds toward the inner end of the hood portion 21A, the tip end portions 22A of the detection pins 22 are smoothly introduced into the spaces 10D, respectively, and the detection pins 22 are kept urged forward (see FIG. 9), or the detection pins 22 are moved back in the direction +W to such an extent that the body portions 22B are not inserted into the insertion holes 34A.

This condition is kept until the front end of the connector housing 10 abuts against the detection pin support wall 1B, thus stopping the insertion of the connector housing. Therefore, since the spacer 34 is not moved upward (in a direction +V), the projected blade 35 moves over the projection 10P on the upper surface of the connector housing 10, and then is disposed immediately adjacent to this projection 10P.

Then, during the time when the connector housing 10 is moved to be withdrawn from the hood portion 21A, the projection 10P is cut by the projected blade 35.

Thus, if the connection terminals 11 are properly inserted in the connector housing 10, the projection 10P on the upper surface of the connector housing 10 is cut.

In contrast, if any of the connection terminals 11 is incompletely inserted in the connector housing 10, so that a retaining projection 10C on an associated lance 10B is not properly engaged in a retaining hole 11A in this connection terminal 11 (see FIG. 10), the tip end portion 22A is prevented by the lance from being fitted into the space 10D as described in the above embodiments.

When the operator tries to further push the connector housing 10, the detection pin 22 is moved back in the testing device by the lance 10B. More specifically, the detection pin 22 is moved rearward against the bias of a coil spring 3, so that the slanting surface 22D of the body portion 22B is brought into contact with the upper edge of the insertion hole 34A in the spacer 34, or the rear upper edge of the body portion 22B contacts the slanting surface 34B of the insertion hole 34A in the spacer 34. As a result, the spacer 34 is moved upward (see FIG. 10), and the projected blade 35 is moved away from the upper surface of the connector housing 10. Therefore, the projected blade 35 will not cut the projection 10P on the upper surface of the connector housing 10.

Thus, merely by confirming whether or not the projection 10P on the upper surface of the connector housing 10 is cut after inserting and withdrawing the connector housing 10, the terminal-inserted condition can be easily examined.

In this embodiment, the spacer 34 is normally urged downward, and if there does not exist any incompletely-inserted connection terminal 11, the projection 10P is automatically cut by the projected blade 35 held in contact with the upper surface of the connector housing 10 to be examined.

In this embodiment, although the projection 10P is automatically cut in accordance with the insertion and withdrawal of the connector housing 10, the invention is not limited to such a construction. For example, there may be provided a construction in which a spacer, normally urged upward as shown in FIG. 1, is kept pressed down, for example, manually during the insertion and withdrawal of the connector housing, thereby applying such cutting to the connector housing.

Further, the confirmation through lighting of an LED as described above may be employed.

In the above embodiments, although the urging means are constituted by the coil springs, the invention is not limited to such arrangement, and any other suitable urging means, such as a leaf spring and a rubber member, may be used.

According to the first embodiment of the invention, the operator can quite easily confirm whether or not the spacer can be moved, and the engaged condition of the terminals can be examined easily in a highly-reliable manner through this confirmation.

According to the second embodiment of the invention, when the connector housing, having the completely-inserted terminals, is inserted into the connector testing device, the detection pins are not moved back, or are moved back to such an extent that the body portion is not inserted into the insertion hole, and the spacer is not moved. In contrast, when the connector housing, having the incompletely-inserted terminal, is inserted into the connector testing device, the detection pin is moved back, and the body portion contacts the slanting surface, so that the spacer is automatically moved downward. Thus, the operator can easily examine the engaged condition of the terminals in a highly-reliable manner without any special operation, that is, merely by inserting the connector housing and then by confirming the movement of the spacer with the eyes.

According to the third embodiment of the invention, the mark can be applied to the connector housing having the completely-inserted terminals, and the mark can not be applied to the connector housing having the incompletely-inserted terminal. Therefore, the engaged condition of the terminals can be examined in a highly-reliable manner by confirming whether or not the mark is present.

According to the fourth embodiment of the invention, if the connector housing has the completely-inserted terminals, the projection on the connector housing can be cut, and if the connector housing has the incompletely-inserted terminal, the projection on the connector housing can not be cut. Therefore, the engaged condition of the terminals can be easily examined in a highly-reliable manner by confirming whether or not the projection is cut.

What is claimed is:

1. A connector testing device for a connector having a space and a lance provided in a connector housing, the lance having a retaining projection for retaining a connection terminal inserted into said connector housing in a rearward direction and being elastically deformable into the space, said connector testing device comprising:

a hood portion for receiving the connector housing in such a manner that an outer surface of the connector housing is in contact with an inner surface of said hood portion;

a detection pin including a tip end portion extending in a forward direction from a body portion thereof so as to be inserted into the space, and a detection portion which extends in said rearward direction from said body portion, and is smaller in cross-sectional area than said body portion, said detection pin being movable in said forward and rearward directions and being normally urged forward;

first urging means for normally urging said detection pin in said forward direction;

a spacer having an insertion hole having such a size as to allow said body portion to pass therethrough, said spacer being movable upward and downward and being normally urged upward, and in an upwardly-urged position of said spacer, said insertion hole allowing the body portion to pass therethrough; and second urging means for normally urging said spacer upward, wherein when said detection pin is disposed in a forward position, only said detection portion passes through said insertion hole, and when said detection pin is disposed in a rearward position, at least part of said body portion passes through said insertion hole.

2. The connector testing device according to claim 1, further comprising: a contact terminal which is connected and disconnected in accordance with the upward and downward movement of said spacer; and an indicator which is activated and deactivated in accordance with the connection and disconnection of said contact terminal.

3. A connector testing device for a connector having a space and a lance provided in a connector housing, the lance having a retaining projection for retaining a connection terminal and being elastically deformable into the space, said connector testing device comprising:

a hood portion for receiving the connector housing in such a manner that an outer surface of the connector housing is in contact with an inner surface of said hood portion;

a detection pin including a tip end portion extending forwardly from a body portion thereof so as to be inserted into the space, and a detection portion which extends rearwardly from said body portion, and is smaller in cross-sectional area than said body portion, said detection pin being movable forward and rearward and being normally urged forward;

first urging means for normally urging said detection pin forward;

a spacer having an insertion hole having such a size as to allow said body portion to pass therethrough, said spacer being movable upward and downward and being normally urged upward; and second urging means for normally urging said spacer upward, wherein at least one of first and second slanting surfaces is formed with respect to said insertion hole and said body portion; said first slanting surface being formed at a front lower edge of said insertion hole and facing generally forwardly, and in an upwardly-urged position of said spacer, said first slanting surface being engageable with a rear edge of said body portion; and said second slanting surface being formed at a rear lower edge of said body portion and facing generally rearwardly, and in the upwardly-urged position of said spacer, said second slanting surface being engageable with a front edge of said insertion hole, and wherein when said detection pin is disposed in a forward position, only said detection portion passes through said insertion hole, and when said detection pin is disposed in a rearward position, at least part of said body portion passes through said insertion hole.

4. The connector testing device according to claim 3, further comprising: a contact terminal which is connected and disconnected in accordance with the upward and downward movement of said spacer; and an indicator which is activated and deactivated in accordance with the connection and disconnection of said contact terminal.

5. A connector testing device for a connector having a space and a lance provided in a connector housing, the lance having a retaining projection for retaining a connection terminal and being elastically deformable into the space, said connector testing device comprising:

a hood portion for receiving the connector housing in such a manner that an outer surface of the connector housing is in contact with an inner surface of said hood portion;

a detection pin including a tip end portion extending forwardly from a body portion thereof so as to be inserted into the space, and a detection portion which extends rearwardly from said body portion, and is smaller in cross-sectional area than said body portion, said detection pin being movable forward and rearward and being normally urged forward;

first urging means for normally urging said detection pin forward;

a spacer having an insertion hole having such a size as to allow said body portion to pass therethrough, said spacer being movable upward and downward and being normally urged downward;

second urging means for normally urging said spacer downward;

a front panel extending from said spacer; and printing means, provided on an inner surface of said front panel, for applying a mark to an outer surface of said connector housing in a downward position of said spacer, wherein at least one of first and second slanting surfaces is formed with respect to said insertion hole and said body portion; said first slanting surface being formed at a front upper edge of said insertion hole and facing generally forwardly, and in a downwardly-urged position of said spacer, said first slanting surface being engageable with a rear edge of said body portion; and said second slanting surface being formed at a rear upper edge of said body portion and facing generally rearwardly, and in the downwardly-urged position of said spacer, said second slanting surface being engageable with a front edge of said insertion hole, and wherein when said detection pin is disposed in a forward position, only said detection portion passes through said insertion hole, and when said detection pin is disposed in a rearward position, at least part of said body portion passes through said insertion hole.

6. The connector testing device according to claim 5, further comprising: a contact terminal which is connected and disconnected in accordance with the upward and downward movement of said spacer; and an indicator which is activated and deactivated in accordance with the connection and disconnection of said contact terminal.

7. A connector testing device for a connector having a space and a lance provided in a connector housing, the lance having a retaining projection for retaining a connection terminal and being elastically deformable into the space, said connector testing device comprising:

a hood portion for receiving the connector housing in such a manner that an outer surface of the connector housing is in contact with an inner surface of said hood portion;

a detection pin including a tip end portion extending forwardly from a body portion thereof so as to be inserted into the space, and a detection portion which extends rearwardly from said body portion, and is smaller in cross-sectional area than said body portion, said detection pin being movable forward and rearward and being normally urged forward;

first urging means for normally urging said detection pin forward;

a spacer having an insertion hole having such a size as to allow said body portion to pass therethrough, said spacer being movable upward and downward and being normally urged upward, and in an upwardly-urged position of said spacer, said insertion hole allowing the body portion to pass therethrough;

second urging means for normally urging said spacer upward;

a front panel extending from said spacer; and printing means, provided on an inner surface of said front panel, for applying a mark to an outer surface of said connector housing in a downward position of said spacer, wherein when said detection pin is disposed in a forward position, only said detection portion passes through said insertion hole, and when said detection pin is disposed in a rearward position, at least part of said body portion passes through said insertion hole.

8. The connector testing device according to claim 7, further comprising: a contact terminal which is connected and disconnected in accordance with the upward and downward movement of said spacer; and an indicator which is activated and deactivated in accordance with the connection and disconnection of said contact terminal.

9. A connector testing device for a connector having a space and a lance provided in a connector housing having a projection formed on an outer surface thereof, the lance having a retaining projection for retaining a connection terminal and being elastically deformable into the space, said connector testing device comprising:

a hood portion for receiving the connector housing in such a manner that an outer surface of the connector housing is in contact with an inner surface of said hood portion;

a detection pin including a tip end portion extending forwardly from a body portion thereof so as to be inserted into the space, and a detection portion which extends rearwardly from said body portion, and is smaller in cross-sectional area than said body portion, said detection pin being movable forward and rearward and being normally urged forward;

first urging means for normally urging said detection pin forward;

a spacer having an insertion hole having such a size as to allow said body portion to pass therethrough, said spacer being movable upward and downward and being normally urged downward;

second urging means for normally urging said spacer downward;

a front panel extending from said spacer; and a projected blade, formed on an inner surface of said front panel, for cutting the projection on said connector housing in a downward position of said spacer, wherein at least one of first and second slanting surfaces is formed with respect to said insertion hole and said body portion; said first slanting surface being formed at a front upper edge of said insertion hole and facing generally forwardly, and in a downwardly-urged position of said spacer, said first slanting surface being engageable with a rear edge of said body portion; and said second slanting surface being formed at a rear upper edge of said body portion and facing generally rearwardly, and in the downwardly-urged position of said spacer, said second slanting surface being engageable with a front edge of said insertion hole, and wherein when said detection pin is disposed in a forward position, only said detection portion passes through said insertion hole, and when said detection pin is disposed in a rearward position, at least part of said body portion passes through said insertion hole.

10. The connector testing device according to claim 9, further comprising: a contact terminal which is connected and disconnected in accordance with the upward and downward movement of said spacer; and an indicator which is activated and deactivated in accordance with the connection and disconnection of said contact terminal.

11. A connector testing device for a connector having a space and a lance provided in a connector housing having a projection formed on an outer surface thereof, the lance having a retaining projection for retaining a connection terminal and being elastically deformable into the space, said connector testing device comprising:

a hood portion for receiving the connector housing in such a manner that an outer surface of the connector housing is in contact with an inner surface of said hood portion;

a detection pin including a tip end portion extending forwardly from a body portion thereof so as to be inserted into the space, and a detection portion which extends rearwardly from said body portion, and is smaller in cross-sectional area than said body portion, said detection pin being movable forward and rearward and being normally urged forward;

first urging means for normally urging said detection pin forward;

a spacer having an insertion hole having such a size as to allow said body portion to pass therethrough, said spacer being movable upward and downward and being normally urged upward, and in an upwardly-urged position of said spacer, said insertion hole allowing the body portion to pass therethrough;

second urging means for normally urging said spacer upward;

a front panel extending from said spacer; and a projected blade, formed on an inner surface of said front panel, for cutting the projection on said connector housing in a downward position of said spacer, wherein when said detection pin is disposed in a forward position, only said detection portion passes through said insertion hole, and when said detection pin is disposed in a rearward position, at least part of said body portion passes through said insertion hole.

12. The connector testing device according to claim 11, further comprising: a contact terminal which is connected and disconnected in accordance with the upward and downward movement of said spacer; and an indicator which is activated and deactivated in accordance with the connection and disconnection of said contact terminal.

* * * * *